(12) United States Patent
Yoshida

(10) Patent No.: US 7,649,194 B2
(45) Date of Patent: Jan. 19, 2010

(54) NITRIDE SEMICONDUCTOR FREE-STANDING SUBSTRATE

(75) Inventor: Takehiro Yoshida, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 385 days.

(21) Appl. No.: 11/541,790

(22) Filed: Oct. 3, 2006

(65) Prior Publication Data
US 2007/0290228 A1  Dec. 20, 2007

(30) Foreign Application Priority Data
Jun. 14, 2006  (JP) .............................. 2006-164573

(51) Int. Cl.
*H01L 29/12* (2006.01)
*H01L 31/12* (2006.01)
*H01L 33/00* (2006.01)

(52) U.S. Cl. ..................... 257/13; 257/79; 257/103; 257/190; 257/E33.059; 257/E25.032

(58) Field of Classification Search ................ 257/190, 257/103, 13, 79, E33.059, E25.032
See application file for complete search history.

(56) References Cited

U.S. PATENT DOCUMENTS 6,086,673 A * 7/2000 Molnar ..................... 117/90
6,673,149 B1   1/2004 Solomon et al.
7,105,865 B2 * 9/2006 Nakahata et al. ............ 257/103
2002/0197825 A1  12/2002 Usui et al.
2003/0213964 A1  11/2003 Flynn et al.
2006/0054076 A1 * 3/2006 Dwilinski et al. ............ 117/3

FOREIGN PATENT DOCUMENTS

| EP | 1 246 233 A2 | 3/2002 |
|---|---|---|
| JP | 11-251253 A | 9/1999 |
| JP | 2003-178984 A | 6/2003 |

OTHER PUBLICATIONS

Akira Usui et al., "Thick GaN Epitaxial Growth with Low Dislocation Density by Hydride Vapor Phase Epitaxy", Jpn. J. Appl. Phys. vol. 36(1997) pp. L899-L902.

Kensaku Motoki et al., "Preparation of Large Freestanding GaN Substrates by Hydride Vapor Phase Epitaxy Using GaAs as a Starting Substrate", Jpn. J. Appl. Phys. vol. 40(2001) pp. L140-L143.

* cited by examiner

*Primary Examiner*—Long K Tran
(74) *Attorney, Agent, or Firm*—Foley & Lardner LLP

(57) ABSTRACT

A nitride semiconductor free-standing substrate formed of a free-standing nitride-based compound semiconductor crystal that has a variation in lattice constant of ±12 ppm or less.

7 Claims, 4 Drawing Sheets

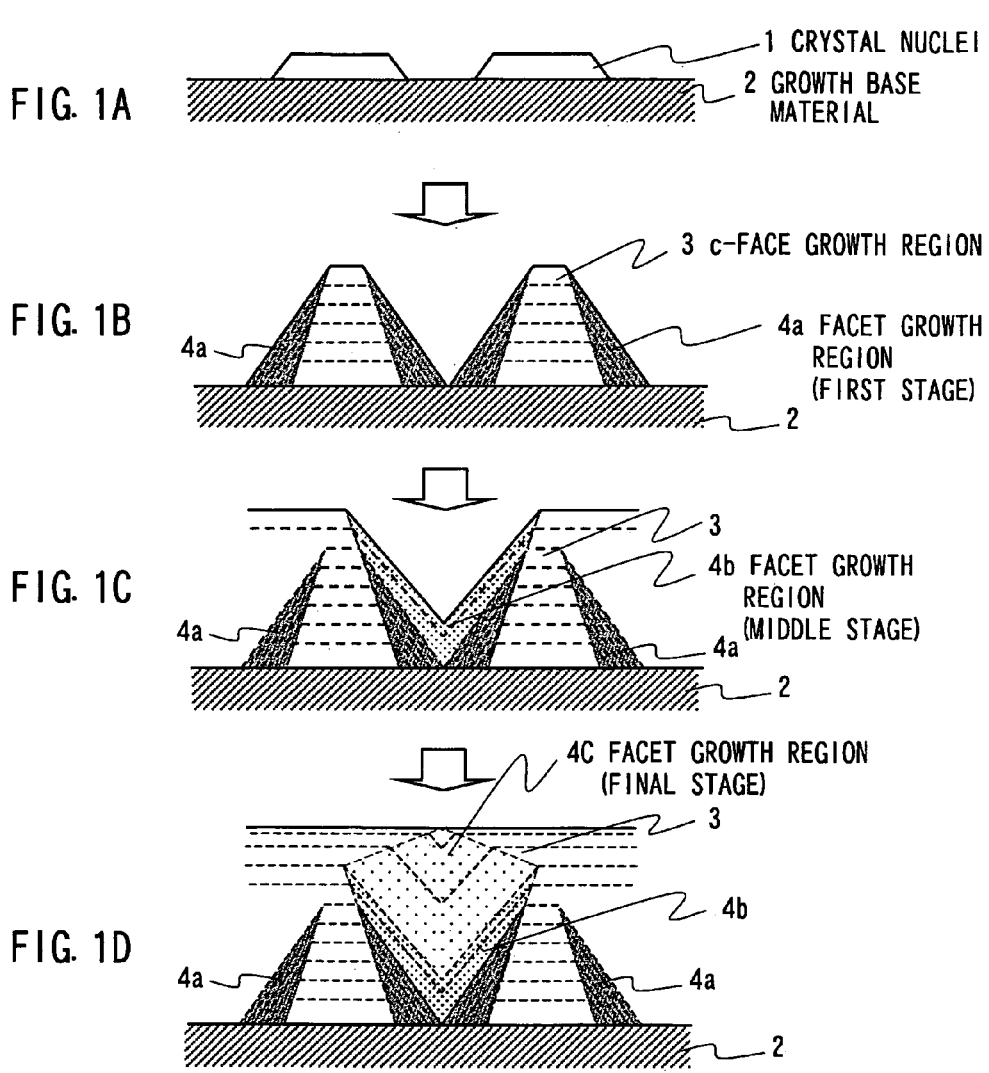

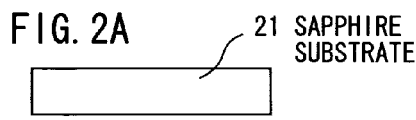
FIG. 2A  21 SAPPHIRE SUBSTRATE
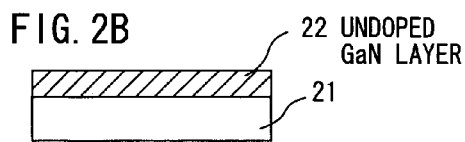
FIG. 2B  22 UNDOPED GaN LAYER
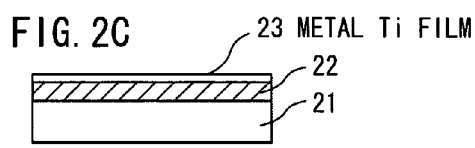
FIG. 2C  23 METAL Ti FILM
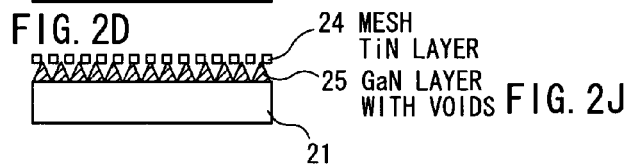
FIG. 2D  24 MESH TiN LAYER / 25 GaN LAYER WITH VOIDS
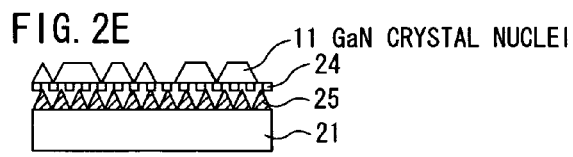
FIG. 2E  11 GaN CRYSTAL NUCLEI
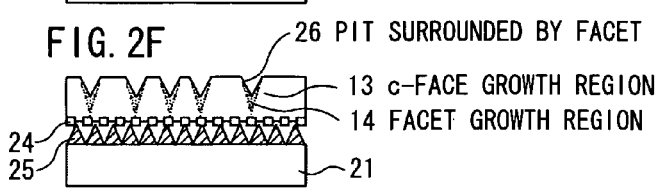
FIG. 2F  26 PIT SURROUNDED BY FACET / 13 c-FACE GROWTH REGION / 14 FACET GROWTH REGION
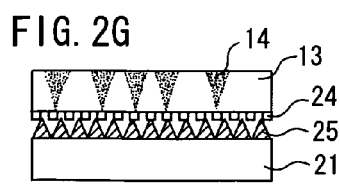
FIG. 2G
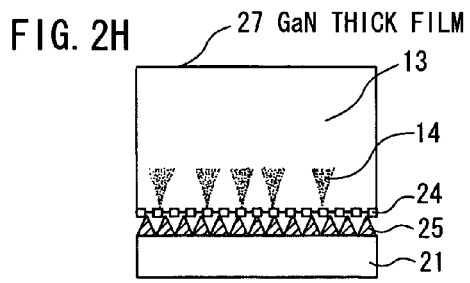
FIG. 2H  27 GaN THICK FILM
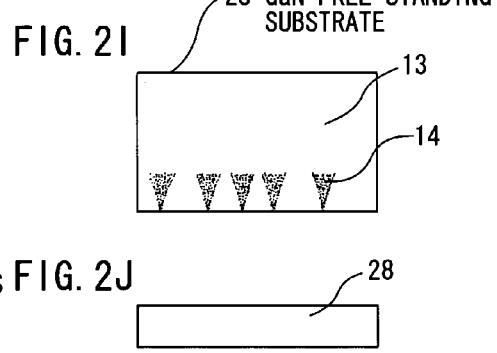
FIG. 2I  28 GaN FREE-STANDING SUBSTRATE
FIG. 2J

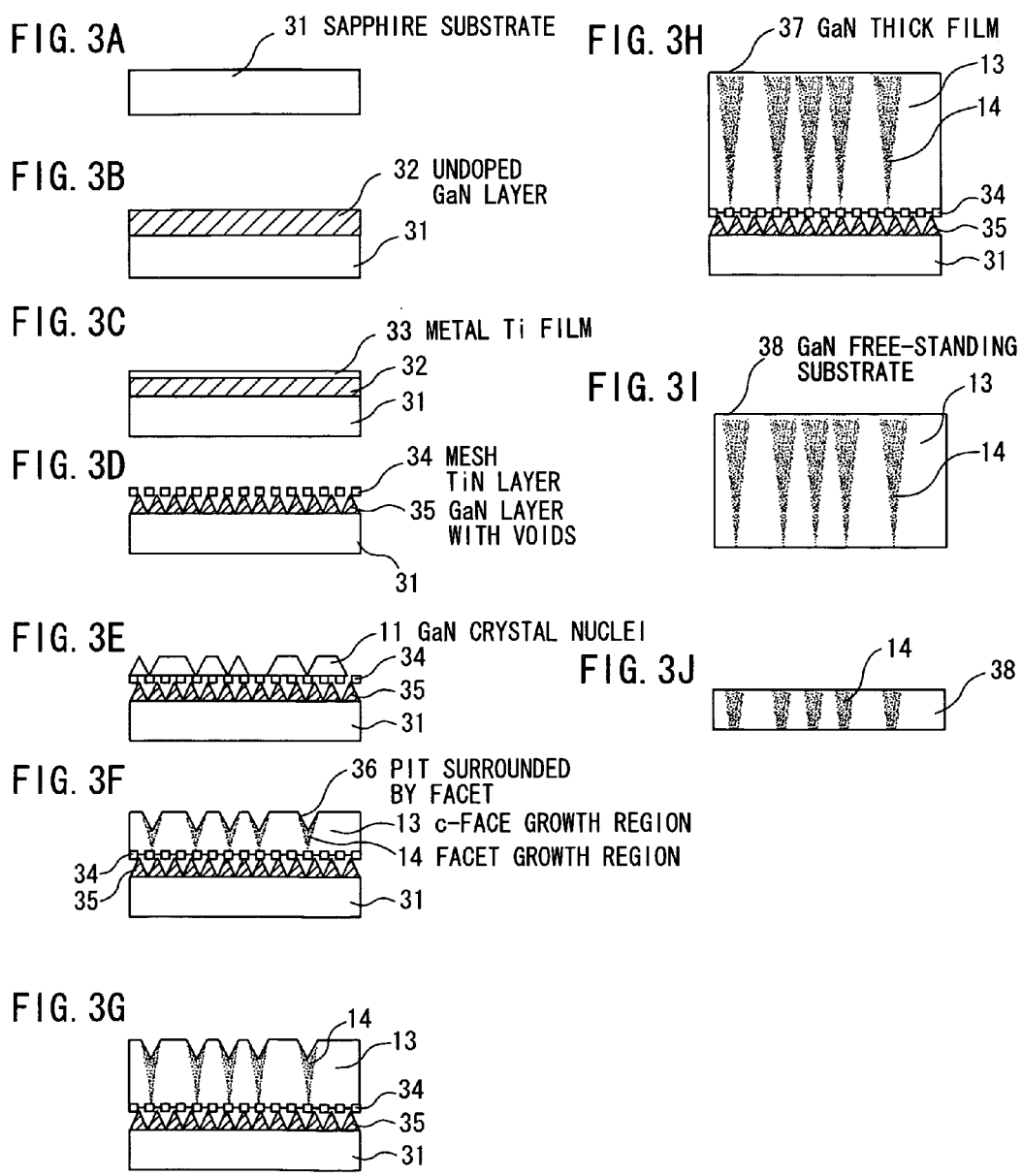

NITRIDE SEMICONDUCTOR FREE-STANDING SUBSTRATE

The present application is based on Japanese patent application No. 2006-164573, the entire contents of which are incorporated herein by reference.

BACKGROUND OF THE INVENTION

1. Field of the Invention

This invention relates to a nitride semiconductor free-standing substrate comprising a nitride-based compound semiconductor crystal and a light emitting device using the substrate. In particular, this invention relates to a nitride semiconductor free-standing substrate that can provide a light emitting device, which is fabricated by using the substrate, with a small variation in emission wavelength, emission output, device lifetime etc., and that can provide the light emitting device with an enhanced yield, and relates to the light emitting device using the substrate.

2. Description of the Related Art

Nitride semiconductor materials have a sufficiently wide bandgap and are of direct transition type in inter-band transition. Therefore, they are a great deal researched to be applied to a short-wavelength light emitting device. Further, they have a high saturation drift speed of electron and can use two-dimensional electron gas obtained by hetero junction. Therefore, they are also expected to be applied to an electronic device.

Nitride semiconductor layers constituting these devices are epitaxially grown on a base substrate by a vapor phase growth method such as MOVPE (metalorganic vapor phase epitaxy), MBE (molecular beam epitaxy), HVPE (hydride vapor phase epitaxy) etc. However, it was difficult to obtain a high quality growth layer since no underlying substrate is found which lattice-matches to the nitride-based semiconductor layer. Thus, a number of crystal defects must be included in the obtained nitride semiconductor layer. The crystal defect is an impediment to the improvement of the device characteristics. Therefore, it is actively researched to reduce the crystal defect in the nitride semiconductor layers.

A known method for growing a group III nitride-based compound semiconductor crystal with a relatively low crystal defect density is conducted such that a low-temperature deposition buffer layer is formed on a hetero-substrate such as a sapphire substrate, and then an epitaxial layer is grown thereon. In the crystal growth method using the low-temperature deposition buffer layer, AlN or GaN is deposited on the substrate such as a sapphire substrate at about 500 degrees C. to form thereby an amorphous film or continuous film partially containing polycrystal. Then, the film is heated at about 1000 degrees C., and thereby the film is partially vaporized or crystallized so that high-density crystal nuclei are formed. By using it as growth nuclei, GaN film with a relatively good crystal quality is obtained. However, even when conducting the growth method using the low temperature deposition buffer layer, the resultant substrate must have a considerable number of the crystal defects such as a penetrating dislocation and a void. Therefore, this method is insufficient for producing a presently-desired high-performance device.

To solve the problem described above, in recent years, a GaN single crystal substrate (hereinafter referred to as "GaN free-standing substrate") as a GaN substrate for growing crystal has been developed. For example, JP-A-1999-251253 discloses a method for producing the free-standing GaN substrate. The method is conducted such that a GaN layer is grown on a sapphire substrate by using ELO (epitaxial lateral overgrowth), which is a method to obtain a GaN layer with a low dislocation density by forming a mask with openings on an underlying substrate and growing laterally the GaN layer through the openings of the mask, and then the sapphire substrate is removed by etching to obtain the GaN free-standing substrate.

A further advanced method than the ELO is FIELO (facet-initiated epitaxial lateral overgrowth) (e.g. Akira Usui et. al., "Thick GaN Epitaxial Growth with Low Dislocation Density by Hydride Vapor Phase Epitaxy", Jpn. J. Appl. Phys. Vol. 36(1997) pp. L899-L902). Although the FIELO is similar to the ELO in that a selective growth is conducted by using an oxide silicon mask, it is different than the ELO in that a facet is formed on the opening of the mask in the selective growth. By the facet thus formed, the dislocation is changed in propagation direction thereof, so that the penetrating dislocation reaching the upper face of the epitaxial growth layer can be reduced. Therefore, by growing a thick GaN film on an underlying substrate such as sapphire by using the FIELO and then removing the underlying substrate, a high-quality GaN free-standing substrate with relatively reduced crystal defects can be obtained.

Other than the above methods, DEEP (dislocation density elimination by the epi-growth with inverted-pyramidal pits) is known as a method for producing the GaN free-standing substrate with a low dislocation density (e.g. Kensaku Motoki et al., "Preparation of Large Freestanding GaN Substrates by Hydride Vapor Phase Epitaxy Using GaAs as a Starting Substrate", Jpn. J. Appl. Phys. Vol. 40(2001) pp. L140-L143). The DEEP is conducted such that GaN is grown on a GaAs substrate by using a patterned mask of SiN etc. while intentionally forming pits surrounded by facets on the surface of crystal, and a dislocation density is accumulated at the bottom of the pits so that a low dislocation density can be obtained in the other region to the pits.

The GaN substrate obtained by the ELO and the FIELO has usually, in the as-grown crystal, morphology such as a pit and a hillock on the surface thereof. Thus, it is difficult to grow thereon an epitaxial layer for a device. Therefore, it is typically conducted that the GaN substrate is polished to have a mirror surface and is used for fabricating the device.

Further, as a method for producing the GaN substrate with a low dislocation density, JP-A-2003-178984 discloses a method that a GaN layer is formed on c-face ((0001) face) of a sapphire substrate, a titanium film is formed thereon, the substrate is heated in an atmosphere containing hydrogen gas or hydrogen-containing compound gas to form voids in the GaN layer, and a GaN semiconductor layer is formed on the GaN layer.

It is true that the dislocation density in the GaN free-standing substrate produced by the above methods is reduced. However, according to further researches of the inventor, it is found that, when plural devices are fabricated by growing a light emitting device structure on the GaN free-standing substrate and being mounted, a large variation in emission wavelength are recognized among the devices, and some of the devices have a very low emission output and lifetime. When the emission wavelength, emission output and lifetime of the devices are thus varied relative to designed values thereof, the yield of the device will lower.

SUMMARY OF THE INVENTION

It is an object of the invention to provide a nitride semiconductor free-standing substrate that, when a light emitting device structure is formed by using it, provides a reduced variation in emission wavelength, emission output, lifetime etc. with the device so that the yield of the device can be enhanced.

Further, it is another object of the invention to provide a light emitting device using the substrate.

As the result of keen researches, the inventors found: (A) that the large variation in emission wavelength, emission output and lifetime in plane of the substrate is caused by a newly generated dislocation density in the light emitting device structure which is grown on the substrate, and that this dislocation is caused by unevenness in lattice constant in plane of the substrate; (B) that, by controlling a variation in lattice constant to be within a predetermined range, the variation in emission wavelength, emission output and lifetime of the device can be significantly reduced. The invention has been completed based on the above findings.

(1) According to one aspect of the invention, a nitride semiconductor free-standing substrate comprises:

a free-standing nitride-based compound semiconductor crystal that comprises a variation in lattice constant of ±12 ppm or less.

In the above invention (1), the following modifications and changes can be made.

(i) The free-standing nitride-based compound semiconductor crystal comprises $Al_xIn_yGa_{1-x-y}N$ ($0 \leq x+y \leq 1$).

(ii) The variation in lattice constant comprises a variation of measured a-axis lengths.

(iii) The variation in lattice constant comprises a variation of measured lattice constants in plane of a region except a part ranging 2 mm inside from an outermost circumference of the substrate in a radius direction.

(2) According to another aspect of the invention, a light emitting device comprises:

the nitride semiconductor free-standing substrate as defined above; and a light emitting layer comprising a nitride-based compound semiconductor and formed on the substrate.

ADVANTAGES OF THE INVENTION

The nitride semiconductor free-standing substrate of the invention can provide a light emitting device structure to provide a reduced variation in emission wavelength, emission output, lifetime etc. of the device, and can provide many light emitting devices with desired properties according to the designed values.

Thus, in producing a nitride semiconductor light emitting device by using the nitride semiconductor free-standing substrate, the yield of the device can be drastically increased.

BRIEF DESCRIPTION OF THE DRAWINGS

The preferred embodiments according to the invention will be explained below referring to the drawings, wherein:

FIGS. 1A to 1D are cross sectional views schematically showing a crystal growing process of GaN;

FIGS. 2A to 2J are cross sectional views schematically showing a method of making a GaN free-standing substrate in a preferred embodiment according to the invention;

FIGS. 3A to 3J are cross sectional views schematically showing a making process of a GaN free-standing substrate in a comparative embodiment relative to the invention;

DETAILED DESCRIPTION OF THE PREFERRED EMBODIMENTS

Figure 4:
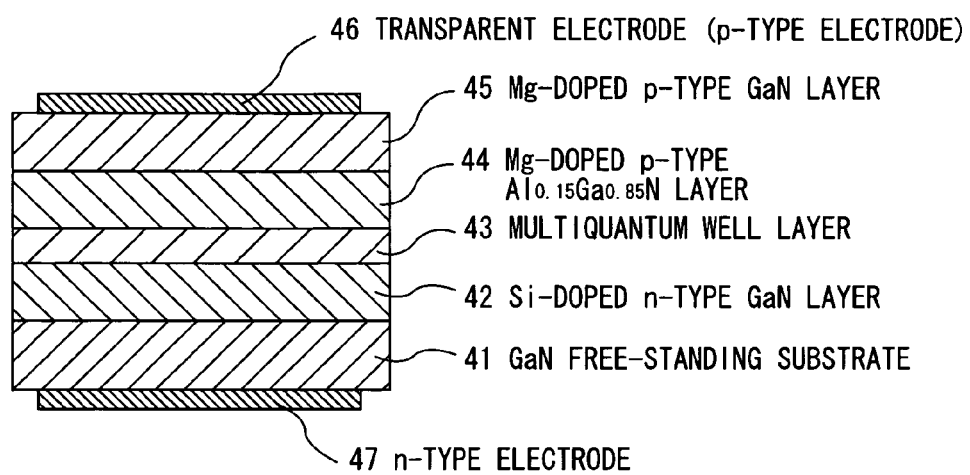
FIG. 4 is a cross sectional view schematically showing an LED fabricated using the GaN free-standing substrate in the preferred embodiment according to the invention.

A nitride semiconductor free-standing substrate of the invention is characterized in that the variation of a lattice constant in plane of the substrate is controlled within a predetermined range. The variation of the lattice constant in planed of the substrate is associated with an impurity concentration distribution formed in the crystal growth process. Therefore, an example of the GaN free-standing substrate will be explained below referring to the crystal growth process.

Crystal Growth Process of GaN Free-Standing Substrate

Referring to FIG. 1, the cause of formation of regions with different lattice constants will be explained below.

As shown in FIG. 1, the growth of GaN follows, in most cases, a growth manner called Volmer-Waber type that a number of three dimensional nuclei are generated at the beginning of the growth, and then these are connected together to form a continuous film.

At first, plural crystal nuclei 1 are generated on a growth base material 2 (FIG. 1A). Each of the crystal nuclei 1 is grown in a c-face growth region 3 where crystal growth of c-face ((0001) face) is conducted and in a facet growth region (first stage) 4a where crystal growth of facet faces ((11-22), (1-102), (11-23), (11-25) faces etc.) (FIG. 1B) is conducted. In this case, since the crystal growth rate of the facet face is slower than that of the c-face, the facet growth region (first stage) 4a is relatively likely to absorb impurity. When the facet growth regions (first stage) 4a begin connecting together on the growth base material 2, a facet growth region (middle stage) 4b is formed on the connected facet growth regions (first stage) 4a (FIG. 1C). Then, a facet crystal-growing region (final stage) 4c is formed thereon and, finally, the facet growth region (final stage) 4c is connected to the c-face growth region 3 (FIG. 1D).

As shown in FIGS. 1B-1D, the high impurity concentration region appears while extending in the crystal growth direction as the history of the facet crystal-growing regions (i.e., the first stage 4a, the middle stage 4b and the final stage 4c). Thus, since the regions with the different impurity concentrations reach the surface of the substrate or near the surface of the substrate, regions with different impurity concentrations necessarily appear in plane of the GaN substrate after polishing and, simultaneously, the lattice constant is varied therein.

As explained above, since the GaN free-standing substrate uses an epitaxially grown thick GaN crystal as a substrate, regions with uneven impurity concentrations can exist locally in the substrate.

In consideration of this, the inventor found that, although grown forming the facet just at the initial stage of the growth process, the GaN thick film is grown such that it is flattened before its thickness reaches 350 µm, preferably 250 µm, more preferably 100 µm (i.e., before completing the steps as shown in FIGS. 1A-1D), and only the c-face is formed always at the growth interface of a upper region than there, thereby allowing the reduction of the variation in lattice constant in a region (i.e., a surface region except a region ranging 2 mm inside from the outermost circumference at its Ga polarity face) to be practically used in plane of the substrate.

Range of Lattice Constant

As the result of detailed experiments, the inventor found that the problem as described earlier can be solved by using a nitride semiconductor substrate that has a variation of ±12 ppm or less in lattice constant (especially, a-axis length) in a region (i.e., a surface region except a region ranging 2 mm inside in the radius direction from the outermost circumference at its Ga polarity face) to be practically used in plane of the substrate. Meanwhile, "variation" used herein means a value calculated by dividing the standard deviation of measured lattice constants by its average value.

For example, the variation of the lattice constant, especially, the variation of the a-axis length is ±12 ppm or less, preferably ±10 ppm or less, more preferably ±8 ppm or less. When the variation of the a-axis length becomes more than ±12 ppm, the variation of emission wavelength in LED drastically increases as evident from the result of Examples described later, and the ratio of obtaining a chip with an output as high as 6 mW and a lifetime of 5000 hours or more drastically decreases.

Measurement of Lattice Constant

The lattice constant of the GaN free-standing substrate can be calculated by the following formulas (1) and (2), using a lattice spacing $d_{0006}$ of GaN (0006) and a lattice spacing $d_{20\text{-}24}$ of GaN (20-24) obtained by X-ray diffraction measurement. Formula (1) is used to calculate a c-axis length, and formula (2) is used to calculate an a-axis length.

$$c = 6 \times d_{0006} \quad (1)$$

$$a = 2 \times d_{2000} = \frac{2}{\sqrt{\left(\frac{1}{d_{20-24}}\right)^2 - \left(\frac{6}{4 \times c}\right)^2}} \quad (2)$$

The reason why GaN (0006) and GaN (20-24) are used for the measurement of the lattice constant is because its measurement error can be decreased thereby. $d_{2000}$ in formula (2) indicates a lattice spacing of GaN (2000).

Measurement Conditions

Preferred measurement conditions in the X-ray diffraction measurement will be explained below. The X-ray diffraction measurement is conducted by using X' Pert-MRD manufactured by Spectris Co., Ltd. It is preferred that the positive electrode of an X-ray tube is made of Cu, accelerating voltage is 45 kv, and current to flow in the filament is 40 mA. An optical system disposed ahead of the tube may comprise, in sequence, a divergence slit of ½ degree, an X-ray mirror, a Ge (220) bicrystal monochromator, and a cross slit collimator with a lateral width of 0.2 mm and a longitudinal width of 0.2 mm. It is preferred that the lattice constant is measured at intervals of 1 mm in the diameter direction in order to check a lattice constant distribution in plane of a GaN-free-standing substrate with a diameter of 2 inches. In this case, it is desired that a region ranging 2 mm inside from the outermost circumference of the substrate in the radius direction is excluded from the object of the evaluation.

Meanwhile, although lattice constants in the crystal structure of a nitride semiconductor include generally a-axis length and c-axis length, the invention considers a variation of especially the a-axis length as a variation of the lattice constant.

Example 1

A GaN epitaxial layer is grown on a sapphire substrate by VAS (void-assisted separation) method and then a GaN free-standing substrate is formed by removing the sapphire substrate and was evaluated. The details of the VAS method are described in JP-A-1999-251253. In brief, the VAS method is a method that crystal growth is conducted sandwiching a titanium nitride (TiN) layer with a mesh structure between the sapphire substrate and a GaN growth layer.

A method of making a GaN free-standing substrate of Example 1 will be explained below with reference to FIGS. 2A to 2J.

At first, a single crystal c-face sapphire substrate 21 of 2 inches diameter is provided (FIG. 2A) and, on the sapphire substrate 21, an undoped GaN layer 22 is grown 300 nm in thickness using trimethylgallium (TMG) and $NH_3$ (FIG. 2B) by MOVPE method. Then, a metal Ti film 23 is deposited 20 nm in thickness on the GaN layer 22 (FIG. 2C), and it is placed in an electric furnace and heated at 1050° C. for 20 minutes in the stream of mixing gas of 20% $NH_3$ and 80% $H_2$. Consequently, a part of the undoped GaN layer 22 is etched and changed into a GaN layer 25 with high-density voids and, simultaneously, the metal Ti film 23 is nitrified and changed into a mesh TiN layer 24 on the surface of which high-density submicron voids are formed. Thus, a substrate (hereinafter referred to as "void-formed substrate") with such a structure as shown in FIG. 2D is obtained.

Then, the void-formed substrate is placed in an HVPE furnace and a GaN crystal is thereon deposited 400 μm in thickness as a whole. Precursors used to grow the GaN crystal are $NH_3$ and GaCl, and a carrier gas used is a mixing gas of 5% $H_2$ and 95% $N_2$. The growth conditions used are atmospheric pressure and substrate temperature of 1040° C. Partial pressures of GaCl and $NH_3$ in the supply gas are set $8 \times 10^{-3}$ atm and $5.6 \times 10^{-2}$ atm, respectively, at the beginning of growth, and its V/III ratio is set 7. In the growth process of the GaN crystal, doping material gas of $SiH_2Cl_2$ is supplied to the substrate region to dope Si.

In the above GaN growth process, at first, GaN crystal nuclei 11 are formed with a three dimensional island shape on the void-formed substrate (FIG. 2E). Then, crystals are grown in the lateral direction to connect together, whereby the surface continues to be flattened (FIG. 2F). As the result of observation using a transmission electron microscope, it is found that most of dislocations disappear while forming a loop with the other dislocation before reaching a thickness of about 1 μm. Therefore, when the whole thickness reaches a few micron meters, by changing the growth conditions into conditions (i.e., substrate temperature of 1080° C. and a V/III ratio of 2) to advance the flattening, the flattening is completed before reaching about 100 μm in the whole thickness (FIG. 2G). This is confirmed by microscope-observing the surfaces and cross sections of the substrates which were grown at various growth times and then taken out from the furnace. After the completion of the flattening, the V/III ratio is back to 7 and a GaN thick film 27 is grown until having 400 μm in the whole thickness (FIG. 2H).

In the cooling process of the HVPE apparatus after the completion of the GaN crystal growth, the GaN thick film 27 is naturally separated bordered by the void layer from the void-formed substrate, and a GaN free-standing substrate 28 is thus obtained (FIG. 2I). The front and back surfaces of the GaN free-standing substrate 28 are mirror-finished while removing 20 μm of the front surface and 50 μm of the back surface to improve the flattening. By the mirror finish, the final height of the GaN free-standing substrate 28 is rendered 330 μm (FIG. 2J).

The lattice constant of the GaN free-standing substrate 28 is calculated by formulas (1) and (2), using a lattice spacing $d_{0006}$ of GaN (0006) and a lattice spacing $d_{20\text{-}24}$ of GaN (20-24) obtained by X-ray diffraction measurement.

The X-ray diffraction measurement is conducted by using the X' Pert-MRD manufactured by Spectris Co., Ltd. The positive electrode of an X-ray tube is made of Cu, accelerating voltage is 45 kv, and current to flow in the filament is 40 mA. An optical system disposed ahead of the tube may comprise, in sequence, a divergence slit of ½ degree, an X-ray mirror, a Ge (220) bicrystal monochromator, and a cross slit collimator with a lateral width of 0.2 mm and a longitudinal width of 0.2 mm. The lattice constant is measured at intervals of 1 mm in the diameter direction in order to check a lattice constant distribution in plane of a GaN free-standing substrate with a diameter of 2 inches. In this case, a region ranging 2 mm inside from the outermost circumference of the substrate in the radius direction is excluded from the object of the evaluation. As a result, the variation of the lattice constant is ±7.39 ppm.

Example 2

A void-formed substrate is placed in the HVPE furnace and the GaN substrate is grown thereon using as precursors $NH_3$ and GaCl and as a carrier gas a mixing gas of 5% $H_2$ and 95% $N_2$. The growth conditions used are atmospheric pressure and substrate temperature of 1040° C. Partial pressures of GaCl and $NH_3$ in the supply gas are set $8 \times 10^{-3}$ atm and $5.6 \times 10^{-2}$ atm, respectively, at the beginning of growth, and its V/III ratio is set 7. In the growth process of the GaN crystal, doping material gas of $SiH_2Cl_2$ is supplied to the substrate region to dope Si.

When the whole thickness reaches 100 µm, by changing the growth conditions into conditions (i.e., substrate temperature of 1080° C. and a V/III ratio of 2) to advance the flattening, the flattening is completed before reaching about 250 µm in the whole thickness. After the completion of the flattening, the V/III ratio is back to 7 and the GaN thick film is grown until having 400 µm in the whole thickness.

In the cooling process of the HVPE apparatus after the completion of the GaN crystal growth, the GaN thick film is naturally separated bordered by the void layer from the void-formed substrate, and a GaN free-standing substrate is thus obtained. The front and back surfaces of the GaN free-standing substrate are mirror-finished while removing 20 µm of the front surface and 50 µm of the back surface to improve the flattening. By the mirror finish, the final height of the GaN free-standing substrate is rendered 330 µm.

As the result of measuring the lattice constant of the GaN free-standing substrate thus obtained as in Example 1, the variation of a-axis length is ±8.92 ppm.

Example 3

A void-formed substrate is placed in the HVPE furnace and the GaN substrate is grown thereon using as precursors $NH_3$ and GaCl and as a carrier gas a mixing gas of 5% $H_2$ and 95% $N_2$. The growth conditions used are atmospheric pressure and substrate temperature of 1040° C. Partial pressures of GaCl and $NH_3$ in the supply gas are set $8 \times 10^{-3}$ atm and $5.6'10^{-2}$ atm, respectively, at the beginning of growth, and its V/III ratio is set 7. In the growth process of the GaN crystal, doping material gas of $SiH_2Cl_2$ is supplied to the substrate region to dope Si.

When the whole thickness reaches 200 µm, by changing the growth conditions into conditions (i.e., substrate temperature of 1080° C. and a V/III ratio of 2) to advance the flattening, the flattening is completed before reaching about 350 µm in the whole thickness. After the completion of the flattening, the V/III ratio is back to 7 and the GaN thick film is grown until having 400 µm in the whole thickness.

In the cooling process of the HVPE apparatus after the completion of the GaN crystal growth, the GaN thick film is naturally separated bordered by the void layer from the void-formed substrate, and a GaN free-standing substrate is thus obtained. The front and back surfaces of the GaN free-standing substrate are mirror-finished while removing 20 µm of the front surface and 50 µm of the back surface to improve the flattening. By the mirror finish, the final height of the GaN free-standing substrate is rendered 330 µm.

As the result of measuring the lattice constant of the GaN free-standing substrate thus obtained as in Example 1, the variation of a-axis length is ±11.94 ppm.

Comparative Example

According to steps as shown in FIGS. 3A to 3J, a GaN substrate (as a comparative example) with an increased variation in lattice constant is produced.

First, by the steps as shown in FIGS. 3A-3D, a void-formed substrate is formed as in FIGS. 2A-2D.

Then, the void-formed substrate is placed in the HVPE furnace and the GaN crystal is grown 400 µm in total thickness. $NH_3$ and GaCl are used as precursors and a mixing gas of 5% $H_2$ and 95% $N_2$ is used as a carrier gas. The growth conditions used are atmospheric pressure and substrate temperature of 1040° C. Partial pressures of GaCl and $NH_3$ in the supply gas are set $8 \times 10^{-3}$ atm and $5.6 \times 10^{-2}$ atm, respectively, at the beginning of growth, and its V/III ratio is set 7. In the growth process of the GaN crystal, doping material gas of $SiH_2Cl_2$ is supplied to the substrate region to dope Si.

In the above GaN growth process, at first, GaN crystal nuclei 11 are formed with a three dimensional island shape on the void-formed substrate (FIG. 3E). Then, crystals are grown in the lateral direction to connect together, whereby the surface continues to be flattened (FIGS. 3F and 3G). Under the same conditions, a GaN thick film 37 is grown until having 400 µm in the whole thickness (FIG. 3H).

In the cooling process of the HVPE apparatus after the completion of the GaN crystal growth, the GaN thick film is naturally separated bordered by the void layer from the void-formed substrate, and a GaN free-standing substrate 38 is thus obtained (FIG. 3I). The front and back surfaces of the GaN free-standing substrate are mirror-finished while removing 20 µm of the front surface and 50 µm of the back surface to improve the flattening. By the mirror finish, the final height of the GaN free-standing substrate 38 is rendered 330 µm (FIG. 3J).

As the result of measuring the lattice constant of the GaN free-standing substrate 38 thus obtained as in Example 1, the variation of a-axis length is ±17.1 ppm.

Experimental Example

A blue light emitting diode (LED) structure as shown in FIG. 4 is formed on a GaN free-standing substrate 41 obtained by Examples 1-3 and Comparative Example, respectively.

First, the c-face GaN free-standing substrate 41 with a diameter of 2 inches is placed in a MOVPE apparatus and then the substrate temperature is set 1075° C. Thus, a Si doped n-type GaN layer 42 with an electron concentration of $4 \times 10^{18}$ $cm^{-3}$ is grown 4 µm thick thereon under conditions of ammonia/TMG=2000 (in mole ratio). Then, the substrate temperature is reduced to 750° C. to form a six-period InGaN/GaN multiquantum well layer 43. Then, the substrate temperature is set 1075° C. and the ammonia/TMG mole ratio is set 8000. Thus, an Mg-doped p-type $Al_{0.15}Ga_{0.85}N$ layer 44 (with a hole concentration=$5 \times 10^{17}$ $cm^{-3}$) is grown 35 nm thick thereon, and then, while changing only the ammonia/TMG mole ratio between 200 and 1000, an Mg-doped p-type GaN contact layer 45 (with a hole concentration=$1\times10^{18}$ cm$^{-3}$) is grown 200 nm thick by the same process as described above. After growing the p-type GaN contact layer 45, the wafer is heated in oxygen at 600° C. for 20 minutes to lower the resistivity of the p-type GaN contact layer 45.

Then, an n-type electrode 47 and a SiO$_2$ film (not shown) are formed on the back surface of the blue LED epitaxial wafer thus obtained, and a transparent electrode 46 (Ni 2 nm/Au 6 nm) to function also as a p-type electrode is formed on the front surface thereof. Thus, the LED structure (wafer) as shown in FIG. 4 is completed. Then, the wafer is cut into 10,000 LED chips with a square chip size of 300 μm×300 μm.

The emission wavelength and emission output of the LED chips are measured. Current fed thereinto is 20 mA. Further, by setting the fed current to be 50 mA, the time when the output is reduced to half relative to the initial output is evaluated as the lifetime (lifetime acceleration test). The evaluation results are shown in Table 1.

TABLE 1

|  | Example 1 | Example 2 | Example 3 | Comparative Example |
|---|---|---|---|---|
| Variation in lattice constant of substrate (ppm) | ±7.39 | ±8.92 | ±11.94 | ±17.1 |
| Variation range of emission wavelength of LED (nm) | 4 | 4 | 6 | 15 |
| Rate of chips with 6 mW output (%) | 81 | 80 | 78 | 50 |
| Rate of chips with a lifetime of 5000 hours or more (%) | 81 | 80 | 78 | 50 |

From the result in Table 1, the following facts are confirmed. The GaN free-standing substrates obtained in Examples 1-3 have a variation in lattice constant of ±12 ppm or less. The light emitting device produced by using the GaN free-standing substrate obtained in Examples 1-3 can have, as compared to that produced by using the GaN free-standing substrate obtained in Comparative Example, a significantly reduced variation range of LED emission wavelength, a significantly increased chip rate with 6 mW output, and a significantly increased chip rate with a lifetime of 5000 hours or more. Further, the yield of LED with a desired design value is significantly improved.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth. For example, although the GaN crystals in Examples 1-3 are grown by the HVPE method, it may be grown by a separate MOVPE process.

Although Examples 1-3 exemplify the sapphire substrate as a growth base material, the invention can be applied to all substrates that are already reported as a substrate, such as GaAs, Si, ZrB$_2$, ZnO etc., for growing a GaN-based epitaxial layer.

Although Examples 1-3 exemplify the Si doped substrate, the invention can be applied to an undoped substrate or a composite free-standing substrate doped with the other dopants such as Mg, Fe, S, O, Zn, Ni, Cr, Se etc.

Although Examples 1-3 exemplify the GaN free-standing substrate, the invention can be applied to the other nitride semiconductor substrates such as an AlN substrate, a mix crystal substrate of InGaN, AlGaN etc.

What is claimed is:

1. A nitride semiconductor free-standing substrate, comprising:
   a free-standing nitride-based compound semiconductor crystal that comprises a variation in lattice constant of ±12 ppm or less;
   wherein the variation in lattice constant comprises a variation of measured a-axis lengths.

2. The nitride semiconductor free-standing substrate according to claim 1, wherein:
   the free-standing nitride-based compound semiconductor crystal comprises Al$_x$In$_y$Ga$_{1-x-y}$N ($0\leq x+y\leq 1$).

3. The nitride semiconductor free-standing substrate according to claim 1, wherein:
   the variation in lattice constant comprises a variation of measured lattice constants in a plane of a region except a part ranging 2 mm inside from an outermost circumference of the substrate in a radius direction.

4. A light emitting device, comprising:
   the nitride semiconductor free-standing substrate as defined in claim 1; and
   a light emitting layer comprising a nitride-based compound semiconductor and formed on the substrate.

5. A nitride semiconductor free-standing substrate, comprising:
   a free-standing nitride-based compound semiconductor crystal that comprises a variation in lattice constant of ±12 ppm or less;
   wherein the free-standing nitride-based compound semiconductor crystal comprises Al$_x$In$_y$Ga$_{1-x-y}$N ($0\leq x+y\leq 1$).

6. The nitride semiconductor free-standing substrate according to claim 5, wherein:
   the variation in lattice constant comprises a variation of measured lattice constants in a plane of a region except a part ranging 2 mm inside from an outermost circumference of the substrate in a radius direction.

7. A light emitting device, comprising:
   the nitride semiconductor free-standing substrate as defined in claim 6; and
   a light emitting layer comprising a nitride-based compound semiconductor and formed on the substrate.

* * * * *

UNITED STATES PATENT AND TRADEMARK OFFICE
CERTIFICATE OF CORRECTION

| | | |
|---|---|---|
| PATENT NO. | : 7,649,194 B2 | Page 1 of 1 |
| APPLICATION NO. | : 11/541790 | |
| DATED | : January 19, 2010 | |
| INVENTOR(S) | : Takehiro Yoshida | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 493 days.

Signed and Sealed this

Twenty-third Day of November, 2010

David J. Kappos
*Director of the United States Patent and Trademark Office*